(12) United States Patent
Beuttel et al.

(10) Patent No.: US 7,376,542 B2
(45) Date of Patent: May 20, 2008

(54) SYSTEM, METHOD AND COMPUTER PROGRAM PRODUCT FOR MODELING A FORCE STRUCTURE

(75) Inventors: Herman W. Beuttel, Renton, WA (US); Richard G. Cline, La Mirada, CA (US)

(73) Assignee: The Boeing Company, Chicago, IL (US)

( * ) Notice: Subject to any disclaimer, the term of this patent is extended or adjusted under 35 U.S.C. 154(b) by 653 days.

(21) Appl. No.: 10/641,952

(22) Filed: Aug. 15, 2003

(65) Prior Publication Data

US 2005/0038628 A1 Feb. 17, 2005

(51) Int. Cl.
*G06G 7/48* (2006.01)
(52) U.S. Cl. .......................................................... 703/6
(58) Field of Classification Search ...................... 703/6
See application file for complete search history.

(56) References Cited

U.S. PATENT DOCUMENTS

| | | | | |
|---|---|---|---|---|
| 5,404,516 | A | * | 4/1995 | Georgiades et al. ........ 718/104 |
| 5,787,333 | A | * | 7/1998 | Rasinski et al. ................ 434/4 |
| 6,497,169 | B1 | * | 12/2002 | Khosla .......................... 89/1.11 |
| 6,997,715 | B2 | * | 2/2006 | Perry et al. .................... 434/11 |
| 2002/0026340 | A1 | * | 2/2002 | Kauffman ....................... 705/7 |

OTHER PUBLICATIONS

Academic Press Dictionary of Science and Technology from Elsevier Science & Technology, 1992, on-line edition (http://www.xreferplus.com/entry/3139479).*
Richard G. Cline; *A Modern Process for Cost Effectiveness Analysis During Concept Exploration*; May 2002; 9 pages; International Society of Parametric Analysts Annual Conference; San Diego, California; available at <http://www.ispa-cost.org/> (visited Jul. 25, 2003).
The United States Army Training and Doctrine Command—Objective Force; *Operational and Organizational Plan for Maneuver Unit of Action*; Jul. 22, 2002; 176 pages; TRADOC Pamphlet 525-3-90/O&O; Fort Monroe, Virginia.

* cited by examiner

*Primary Examiner*—Zoila Cabrera
*Assistant Examiner*—Juan Carlos Ochoa
(74) *Attorney, Agent, or Firm*—Alston & Bird LLP

(57) ABSTRACT

A system, method and computer program product are provided for modeling a force structure. The method of one embodiment generally includes defining a plurality of units of action. The method also includes determining, for each unit of action, a plurality of measures of utility, such as for lethality, knowledgeability, mobility, survivability, deployability, supportability and/or affordability. In this regard, at least one measure of utility has a maximization objective and at least one measure of utility has a minimization objective. After determining the measures of utility, the units of action can be compared based upon the objectives of the plurality of measures of utility of each unit of action. Then, based upon the comparison, at least one optimal unit of action can be identified to thereby model the force structure.

22 Claims, 4 Drawing Sheets

SYSTEM, METHOD AND COMPUTER PROGRAM PRODUCT FOR MODELING A FORCE STRUCTURE

FEDERALLY SPONSORED RESEARCH OR DEVELOPMENT

This invention was made with government support under contract numbers MDA-972-00-9-0001 and MDA-972-02-9-0005 awarded by the Defense Advanced Research Projects Agency (DARPA). The government may have certain rights in this invention.

FIELD OF THE INVENTION

The present invention relates generally to systems and methods for modeling a force structure and, more particularly, relates to systems, methods and computer program products for modeling a force structure based upon a plurality of measures of utility associated with the force structure.

BACKGROUND OF THE INVENTION

Just as in designing commercial organizations, such as business structure and makeup, it is often desirable to design non-commercial and military organizations. In this regard, the Future Combat Systems (FCS) program is an integral component, with other key complementary U.S. Government and commercial programs, in the U.S. Army's goal to be "fully transformed" and attain "objective force" by the end of this decade. More particularly, it is the goal of the FCS program to design a force structure comprising a networked "system of systems"—one large system made up of eighteen individual systems, plus the network, plus the soldier. It utilizes advanced communications and technologies to link soldiers with both manned and unmanned ground and air platforms and sensors. The FCS force structure is agile—allowing forces to move quickly—and versatile—which allows troops to conduct a variety of missions.

During conceptual design of a force structure, such as in accordance with the FCS program, characteristics of each weapon system (e.g., missile system, radio system, sensor system, armored vehicle system, etc.) that comprises a force may be undefined or are free to vary through continuous and/or discrete space. Further, the quantities of the individual weapon, sensor or support systems, or their ratios and proportions in the context of the entire force structure, are free to move through nominal space. It is obvious that the available trade space for this type of problem is quite large. And in the context of the FCS program, the difficulty in evaluating the trade space is compounded by the USA/DARPA requirement to assess each alternative with respect to seven distinct objective functions (mobility, lethality, knowledgeability, survivability, sustainability, deployability and affordability).

Traditional defense acquisitions and the associated analysis (within the USA and industry) have evolved to replace or introduce unitary systems (e.g., single missile system, radio system, armored vehicle system, etc.) into an existing and fixed force structure. The trade space, therefore, has traditionally been relatively modest and the models/tools, consequently, have very limited abilities to explore trade space. In the context of the seven objective functions, existing processes parcel-out the analysis to stove-piped organizations. For example, a logistics organization may apply its methods to a proposed set of configurations, while a finance organization evaluates the costs of the proposed set of configurations, and an operations analysis organization evaluates force or operational effectiveness. These analysis issues severely limit the ability to explore design space and generally take an inordinate amount of time.

SUMMARY OF THE INVENTION

In light of the foregoing background, embodiments of the present invention provide systems, methods and computer program products for modeling a force structure. Embodiments of the present invention are capable of modeling a force structure such that the force structure can be rapidly evaluated in trade space, while simultaneously assessing a plurality of measures of utility, where one or more may have a maximization objective and one or more may have a minimization objective. In this regard, embodiments of the preset invention are capable of modeling a force structure by defining various candidate force structures, quantifying the values of all the measures of utility for each force structure, and rapidly identifying optimal force structures from the candidate force structures, where, for example, the optimal force structures may be identified as those lying on a Pareto boundary.

According to one aspect of the present invention, a method is provided for modeling a force structure. The method of one embodiment generally includes defining a plurality of units of action. The method also includes determining, for each unit of action, a plurality of measures of utility, such as for lethality, knowledgeability, mobility, survivability, deployability, supportability and/or affordability. In this regard, at least one measure of utility has a maximization objective and at least one measure of utility has a minimization objective. For example, the measures of lethality, knowledgeability, mobility and/or survivability can have a maximization objective. Also, for example, the measures of deployability, supportability and/or affordability have a minimization objective.

After determining the measures of utility, the units of action can be compared based upon the objectives of the plurality of measures of utility of each unit of action. After comparing the units of action, at least one optimal unit of action can be identified based upon the comparison of the units of action. In this regard, the optimal units of action can be identified by first determining a Pareto Optimal set of units of action. Then, the optimal units of action can be selected from the Pareto Optimal set, such as by analytical means and criteria of selection.

In one more particular example where the measures of utility include lethality, knowledgeability, mobility and/or survivability, a measure of utility for effectiveness can be determined for each unit of action based upon the measures of at least two of lethality, knowledgeability, mobility and/or survivability. The measure of effectiveness, which has a maximization objective, can be determined in any of a number of different manners. For example, the measure of effectiveness can be determined by determining, for each unit of action and a threat, a power score based upon at least two of lethality, knowledgeability, mobility and survivability for the unit of action. Then, the measure of effectiveness can be determined for each unit of action based upon the power score for the respective unit of action in relation to the power score for the threat. After determining the measure of effectiveness, the units of action can be compared based upon the measure of effectiveness and at least one measure of utility with a minimization objective.

In another more particular example where the measures of utility include deployability, supportability and/or affordability, such measures of utility can have a minimization objective. As such, the units of action can be compared based upon the measures of deployability, supportability and/or affordability and at least one measure of utility with a maximization objective. In yet another more particular example, the units of action can each include a number of personnel, sensors, weapons and mobile combat systems. In this regard, a plurality of measures of utility can be determined for each unit of action based upon the personnel, sensors, weapons and mobile combat systems of the respective unit of action.

According to other aspects of the present invention, a system and computer program product are provided for modeling a force structure.

BRIEF DESCRIPTION OF THE DRAWINGS

Figure 1:
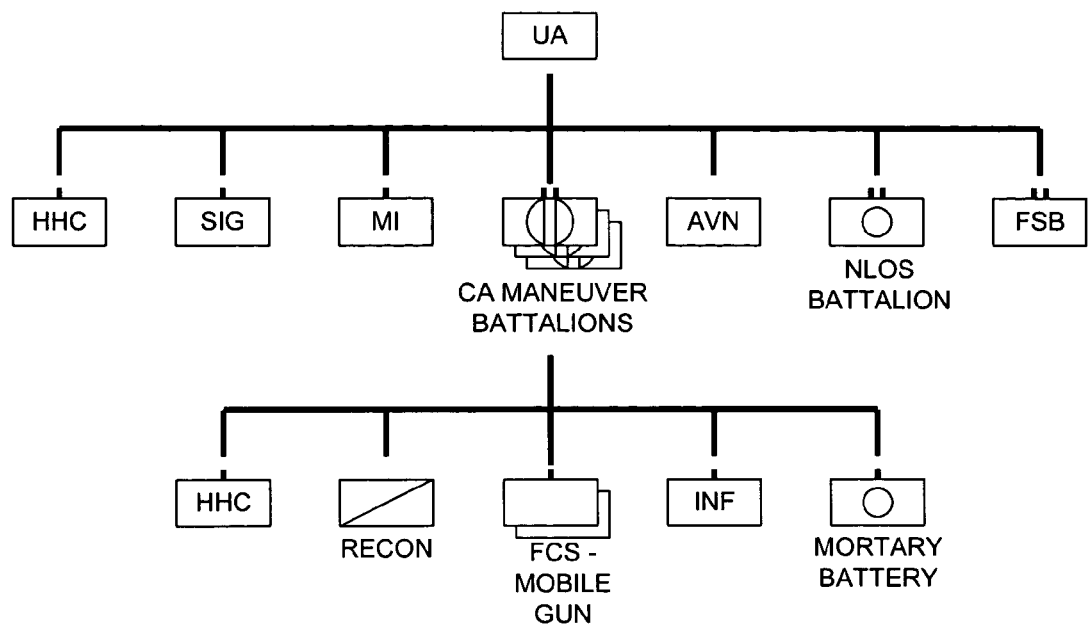
Figure 2:
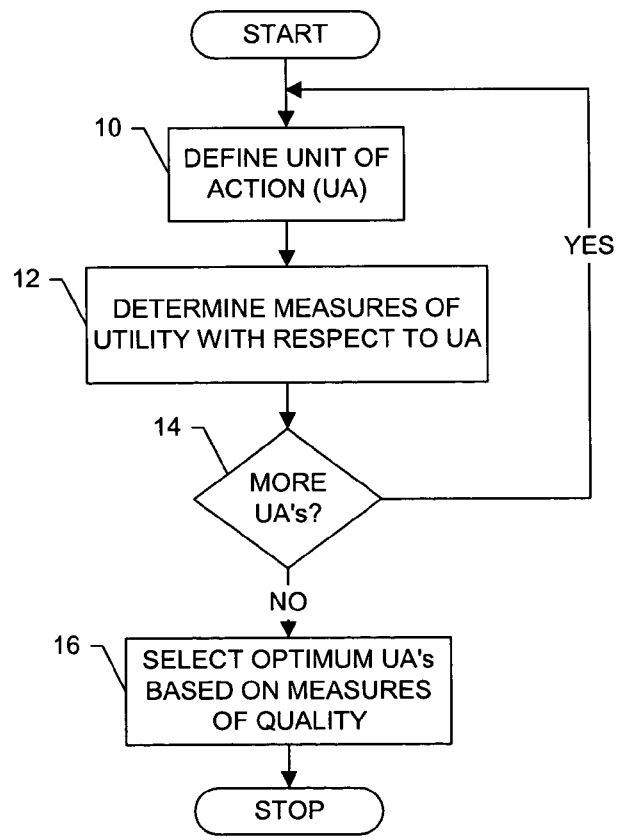
Figure 3:
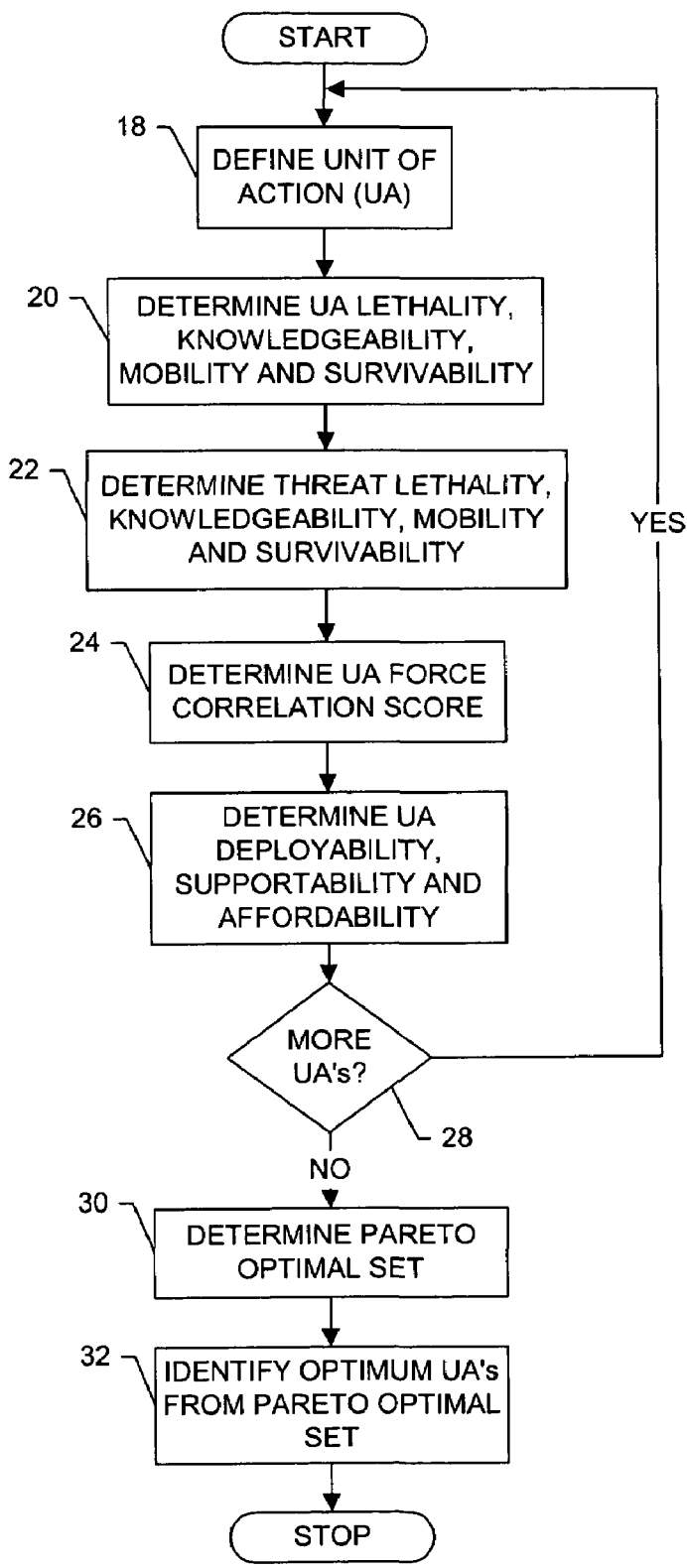
Figure 4:
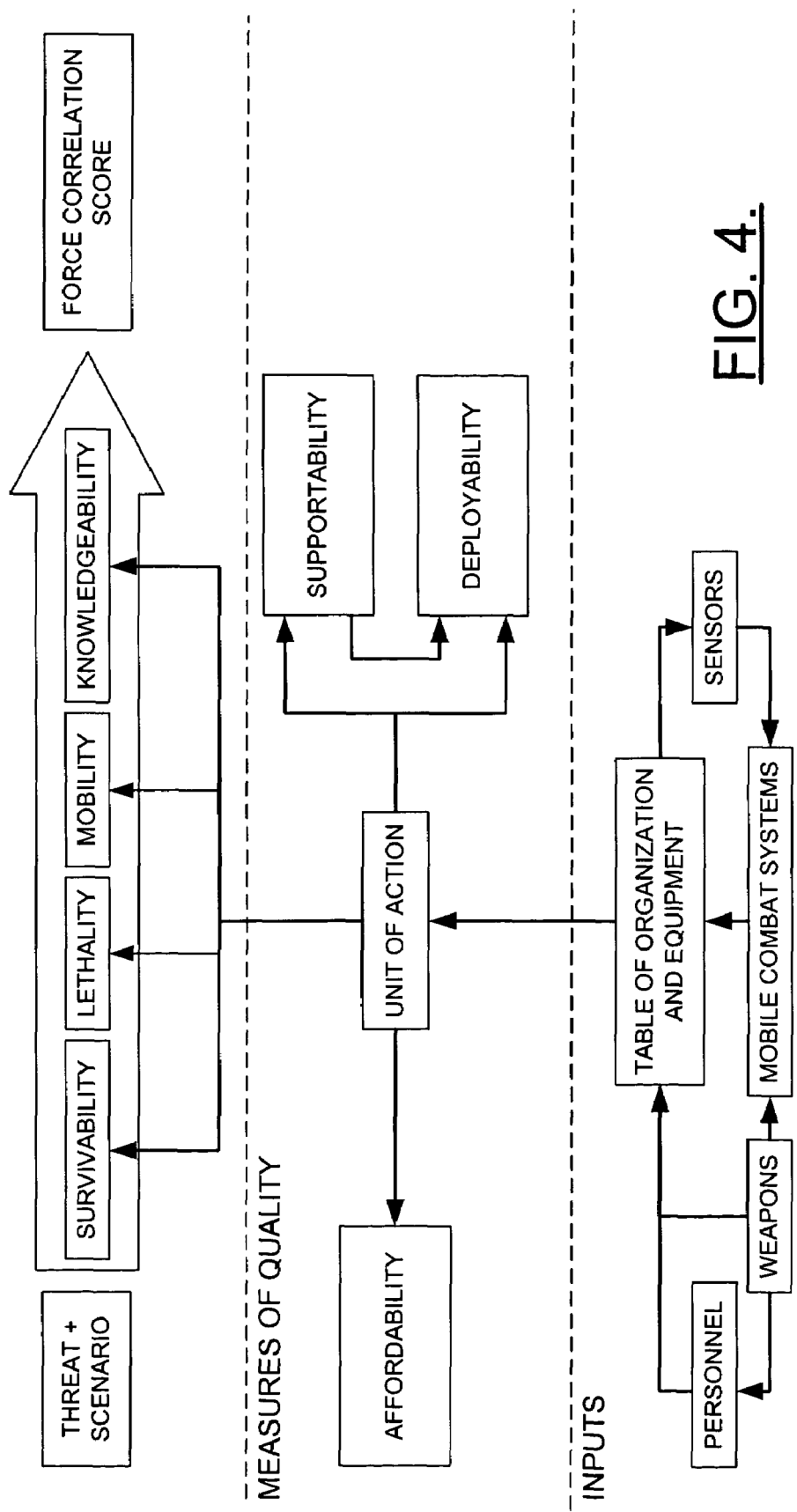
Figure 5:
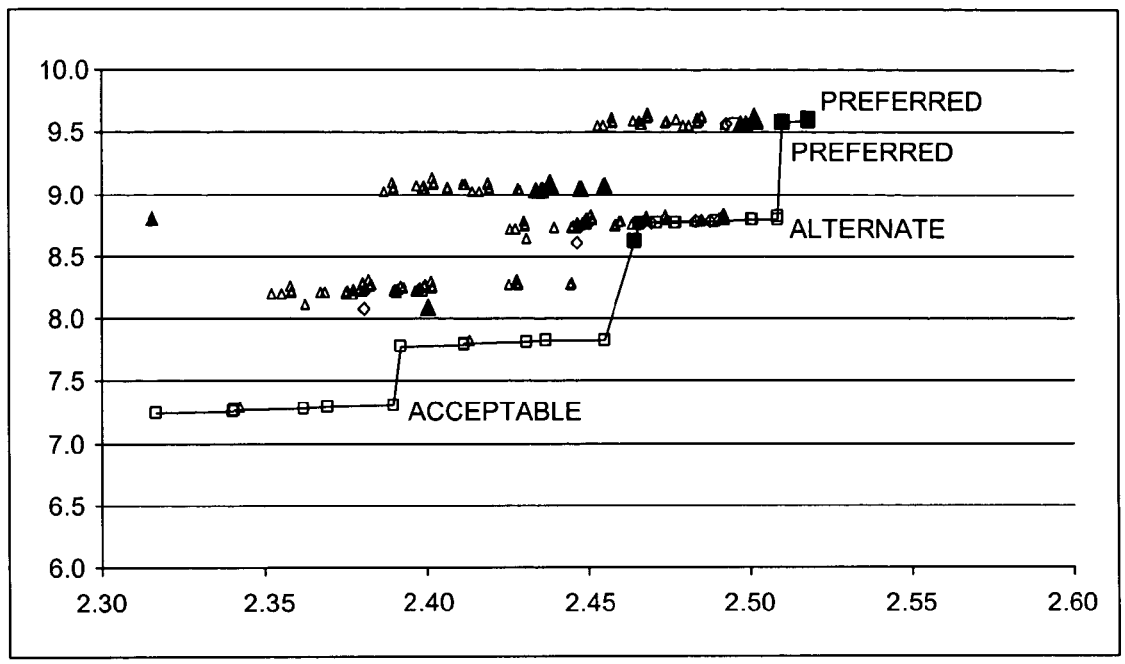
Figure 6:
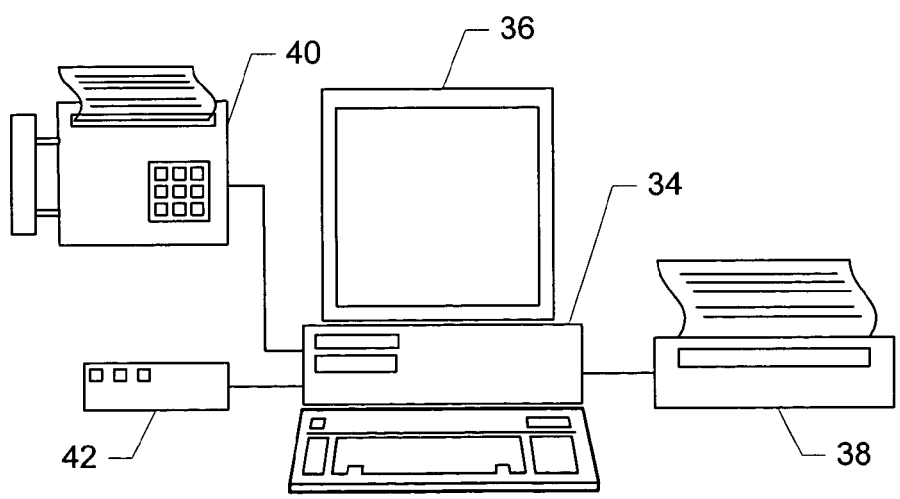

Having thus described the invention in general terms, reference will now be made to the accompanying drawings, which are not necessarily drawn to scale, and wherein:

FIG. 1 is a schematic block diagram of a unit of action defined in accordance with embodiments of the present invention;

FIG. 2 is a flow chart briefly illustrating various steps in a method of modeling a force structure according to one embodiment of the present invention;

FIG. 3 is a flow chart more particularly illustrating various steps in a method of modeling a force structure according to one embodiment of the present invention;

FIG. 4 is a schematic block diagram of the architecture of a system for modeling a force structure according to one embodiment of the present invention;

FIG. 5 is a graph illustrating various units of action defined in accordance with embodiments of the present invention, where each unit of action is shown plotted as a function of a force correlation score and cost; and FIG. 6 is a schematic block diagram of a system for modeling a force structure according to one embodiment of the present invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

A system, method and computer program product according to one aspect of the present invention are provided for modeling a force structure. More particularly, the system, method and computer program product of this aspect are capable of modeling a force structure based upon a number of characteristics. A force structure may be defined in any of a number of different manners. For example, a force structure may be defined as a unit of action (UA) that structurally includes one or more units, such as a headquarters and headquarters company (HHC), a signal company (SIG), a military intelligence company (MI), a number of combined arms (CA) maneuver battalions, an aviation detachment (AVN), a non-line-of-sight (NLOS) battalion, and a forward support battalion (FSB), as shown in FIG. 1. Each CA maneuver battalion can include a HHC, a reconnaissance detachment (RECON), a future combat system (FCS) mobile gun system company (MOBILE GUN), an infantry company (INF), and a mortar battery. Each unit of the UA can be defined by one or more elements of the respective type of element. For example, a UA may be defined in a manner similar to a military brigade, including a quantity of one or more types of personnel, weapons, sensors and mobile combat systems (that may include weapons and sensors). For more information on such a UA, see U.S. Army Training and Doctrine Command (TRADOC), *The United States Army: Objective Force, Operational and Organizational Plan for Maneuver Unit of Action*, TRADOC Pamphlet 525-3-90/O&O (22 Jul. 2002), the contents of which are hereby incorporated by reference in its entirety.

Briefly, and referring to FIG. 2, a method of modeling a force structure generally begins by defining a unit of action (UA), as shown in block 10. The UA can be defined in any of a number of different manners. According to one embodiment, for example, the UA is defined based upon an established baseline UA, such as from a Table of Organization and Equipment (TO&E). Generally, the UA can be defined by changing the baseline UA in isolation or in combination with other changes in a parametric grouping or combinatoric. More particularly, the UA can then be defined by changing the baseline UA, such as by varying, substituting and/or changing one or more of the elements of one or more units of the UA. For example, the UA can be defined by varying one or more weapons, sensors and/or platforms. Additionally, or alternatively, for example, the UA can be defined from the baseline UA by substituting other weapons or platforms, and/or changing number of weapons/platforms/sensors in magnitude, ratio and/or proportion within the TO&E. Further, the UA can additionally or alternatively be defined from the baseline UA by changing numbers of trucks and/or support vehicles, number of personnel, and/or C4 (Command, Control, Communications, Computers) efficiency.

After defining the UA, a number of measures of utility for a number of characteristics of the UA can be determined, as shown in block 12. As will be appreciated, any of a number of different measures of utility can be determined, typically with at least one measure of utility having a maximization objective and at least one measure of utility having a minimization objective. More particularly, as will be appreciated by those skilled in the art, measures of utility for characteristics such as lethality, knowledgeability, mobility, survivability, deployability supportability and/or affordability can be determined with respect to the UA. In this regard, as explained in TRADOC Pamphlet 525-3-90/O&O, lethality can be defined as an assured lethality overmatch against any threat line of sight (LOS), beyond line of sight (BLOS) and non line of sight (NLOS) weapons in all conditions and environments. Knowledgeability can be defined as the ability to acquire knowledge about the environment of the UA, as such may be determined from reconnaissance, surveillance and target acquisition. In this regard, knowledgeability can be measured based upon the numbers, types and characteristics of sensors supporting the personnel of the UA, as well as the efficiency and effectiveness of the UA's command, control, communications and intelligence systems.

Of the other measures of utility, mobility can be defined as the ability to maneuver, such as from cover to cover, considering a wide assortment of terrain variables. Survivability refers to the vulnerability of the UA to threats, and can generally be measured in any of a number of different manners, such as by the ability of the UA to utilize technologies that provide maximum protection of personnel on or off the platform by leveraging the best integration of low observability, active and passive systems and force protection. Deployability typically refers to the responsiveness of the UA in time and distance and sustained momentum, such as by being deployable and capable of quickly and rapidly concentrating combat power in an operational area. Sustainability can be defined as the ability of the UA to sustain operations with a reduced logistics footprint and replenishment demand. And affordability refers to the monetary expenditures associated with forming and maintaining the UA.

As illustrated in block 14, as well as blocks 10 and 12, a set of unique UAs can be defined, with the measures of utility determined for each UA. As indicated above, each UA in the set of UAs can be defined in a number of different manners. In this regard, the UAs can be defined such that one or more characteristics of the elements of the UAs can be optimized in isolation of the remaining characteristics of the elements of the UAs. For example, each UA can be defined by changing one or more predefined characteristics of one or more elements of the baseline UA, while the remaining characteristics of the elements remain constant between the UAs (e.g., remain the characteristics of the elements of the baseline UA). Between the defined UAs, then, the predefined characteristics may be altered such that the predefined characteristics of each defined UA are uniquely defined with respect to the other defined UAs, while the remaining characteristics of the elements of the UAs are the same over the set of UAs.

After defining a number of UAs, and the measures of utility with respect to each UA, one or more optimal UAs can be identified from the set of defined UAs, as shown in block 16. The optimal UAs can be identified in any of a number of different manners. As will be appreciated, it is often desirable for a UA to maximize various measures of utility, while at the same time, minimizing other measures of utility. More particularly, it is often desirable for a UA to maximize measures of utility for lethality, mobility, knowledgeability and survivability, while minimizing measures of utility for affordability, deployability and supportability. From the defined UAs and associated measures of utility, then, one or more optimal UAs can be identified in an attempt to maximize lethality, mobility, knowledgeability and survivability, and simultaneously minimize affordability, deployability and supportability. The optimal UAs can be identified in accordance with any of a number of different techniques including, for example, regression and surrogate measures of utility techniques, development of "composite" measures of utility, and artificial intelligence (AI) techniques. In one particularly advantageous embodiment, however, the optimal UAs are identified according to a Pareto optimization technique including a "composite" measure of utility, as explained below.

Reference is now made to the flow chart of FIG. 3 and schematic block diagram of FIG. 4, which more particularly illustrate various steps in a method of determining measures of utility that can be utilized to identify one or more optimal UAs, and an architecture for determining such measures of utility, respectively, in accordance with one embodiment of the present invention. As shown in block 18, a method of modeling a force structure generally begins by defining a UA, such as in the manner described above. After defining the UA, then, one or more measures of utility sought to be maximized in modeling the force structure can be determined. For example, as shown in block 20, after defining the UA, measures of utility associated with the characteristics lethality, knowledgeability, mobility and survivability can be determined.

The measure of utility associated with the characteristic lethality can be determined in any of a number of different manners. In one embodiment, for example, the measure of utility associated with lethality comprises a qualitative measure of firepower associated with the UA. Typically, the measure of firepower is determined based upon the types of weapons in the UA and the quantity of each type of weapon. Additionally, the measure of firepower may also be based upon one or more environmental and/or situational factors that may be capable of degrading or enhancing the lethality of the weapons. For example, the measure of firepower may also be based upon environmental factors such as terrain, weather and/or season, and/or situational factors such as posture and air superiority. The environmental factors can be determined in any of a number of different manners, such as in accordance with the Quantified Judgment Model (QJM), Simforce and/or Operations Research Society of America (ORSA) tables for score-based models, all of which are well known to those skilled in the art.

More particularly, according to one embodiment, the measure of firepower may be determined according to a technique based upon the Dupuy and Simforce models, as such are well known to those skilled in the art. In this embodiment, the measure of firepower is determined by determining a measure of firepower for each type of weapon independent of environmental and/or situational factors. The measure of firepower for each type of weapon can be determined by multiplying the quantity of the type of weapon with a firepower score for the respective type of weapon. The firepower score can comprise any of a number of different representative scores for the types of weapons including, for example, the Operational Lethality Index (OLI), the Weapons Effectiveness Index (WEI) and the Weighted Unit Value (WUV), or the Firepower Potential (FPP), all of which are well known to those skilled in the art.

After multiplying the quantity of the type of weapon with the firepower score for each type of weapon in the UA, the products can be summed. Thereafter, the sum of the products can be multiplied by one or more environmental and/or situational factors, as described above. Written notationally, the measure of firepower (FP) can be determined according to the following:

$$FP = \sum_{i} (Q_i \times FPS_i) \times \prod_{j} E/S \qquad (1)$$

In equation (1), i represents each type of weapon, $Q_i$ represents the quantity of the ith type of weapon and $FPS_i$ represents the firepower score for the ith type of weapon. Also, j represents each environmental and/or situational factor, and $E/S_j$ represents a measure of the jth environmental and/or situational factor used to determine firepower, where j and $E/S_j$ may be determined, for example, from the QJM model.

The measure of utility associated with the characteristic knowledgeability, like that associated with the characteristic lethality, can be determined in any of a number of different manners. In one embodiment, for example, the measure of utility associated with knowledgeability comprises a quantitative measure of Intelligence, Surveillance and Reconnaissance (ISR) associated with the UA. Typically, the measure of ISR can be determined based upon the types/quantities of sensors in the UA, and can also be based upon the personnel in the UA. Additionally, like the measure of firepower, the measure of ISR may also be based upon one or more environmental and/or situational factors that may be capable of degrading or enhancing the effectiveness of the sensors, and possibly the personnel.

According to one embodiment, the measure of ISR may be determined by first determining a measure of effectiveness of each type of sensor independent of environmental and/or situational factors. The measure of effectiveness for each type of weapon can be determined by the product of measures of a number of different characteristics of the respective type of sensor, such as measures of the field of view, range and resolution. In addition, the product can include a type factor for the respective type of sensor. The type factor for the respective type of sensor, which can be determined in a number of different manners, generally reflects the relative quality of the respective type of sensor as compared to other types of sensors. For example, consider three types of sensors, namely, an active infrared (IR) sensor, an image intensification (II) sensor, and a thermal sensor. Based upon a power of two scheme, and the relative quality of each sensor with respect to the other sensors, the IR sensor can have a type factor of one, while the II sensor has a type factor of two, and the thermal sensor has a type factor of four. Such a technique for determining the type factor in the above example can reflect the technology level of each sensor based upon when the sensor can be used, and whether the sensor is detectable. In this regard, the IR sensor can be used only at night and is detectable, the II sensor can also only be used at night, but is undetectable, and the thermal sensor can be used during the day or at night, and is also undetectable.

Irrespective of how the type factor is determined, after determining the measure of effectiveness for each type of sensor, the measures of effectiveness can be summed. Thereafter, the aggregate effectiveness of the sensors in the UA can be multiplied by one or more environmental and/or situational factors. Written notationally, according to one embodiment, the measure of ISR can be determined according to the following:

$$ISR = \sum_{k} (FoV_k \times R_k \times RF_k \times TF_k) \times \prod_{l} E/S_l \qquad (2)$$

In equation (2), k represents each type of sensor, and $FoV_k$, $R_k$, $RF_k$ and $TF_k$ represent the measures of the field of view, range, resolution factor, and the type factor, respectively, of the kth type of sensor. Also, l represents each environmental and/or situational factor used to determine ISR, and $E/S_l$ represents a measure of the ith environmental and/or situational factor, where l and $E/S_l$ may be determined, for example, based upon the QJM model.

According to another embodiment, the measure of ISR can be determined based upon the aggregate effectiveness of the sensors in the UA accounting for one or more environmental and/or situational factors. In this embodiment, however, the measure of ISR is also based upon personnel in the UA weighted based upon effectiveness to knowledgeability (referred to herein as ISR personnel). In addition, the measure of ISR is based upon a firepower score for vehicles, such as motorcraft, aircraft, rotorcraft and the like, in the UA, particularly those vehicles designed for reconnaissance. The measure of ISR can further be based upon a measure of Command, Control, Communications and Intelligence (C3I) systems in the UA, typically modified by a measure of the camouflage, concealment and deception (CC&D) of a threat.

More particularly as to this embodiment, the measure of ISR can be determined by determining the aggregate effectiveness of the sensors in the UA accounting for environmental and/or situational factors, such as in a manner shown notationally by equation (2). The number of ISR personnel in the UA can then be added to the aggregate effectiveness for the sensors. The number of ISR personnel can be directly added to the aggregate efficiency and/or effectiveness. In one advantageous embodiment, however, the number of ISR personnel is weighted to account for those personnel specially trained in reconnaissance. In this regard, the number of ISR personnel can be determined by summing one or more different types of personnel, where at least one type of personnel has been multiplied by a scale factor. For example, the number of ISR personnel can be determined by multiplying the number of scouts, special forces personnel and those personnel responsible for long range surveillance units (LRSUs) by one or more scale factors, then summing the products together with the number of troops in the UA. Written notationally, for example, the number of ISR personnel ($P_{ISR}$) can be determined according to the following:

$$P_{ISR} = P + SC(f_1 - 1) + (SF + LRSU) \times (f_2 1) \qquad (3)$$

In equation (3), P represents the number of personnel in the UA, SC represents the number of scouts, SF represents the number of special forces personnel and LRSU represents the number of personnel responsible for LRSUs. Also in equation (3), $f_1$ (e.g., 2) and $f_2$ (e.g., 10) represent first and second scaling factors.

After determining the aggregate effectiveness of the sensors and the number of ISR personnel, the aggregate effectiveness and number of ISR personnel can be summed together with a firepower score for vehicles in the UA that are designed for reconnaissance. The sum can then be multiplied by measures of C3I for the UA and CC&D for a threat, and divided by the number of ISR troops. For example, presuming a UA that includes reconnaissance armored fighting vehicles (AFVs) and helicopters, the measure of ISR can be determined in this embodiment as follows:

$$ISR = \frac{[P_{ISR} + ISR_s + FPS_{AFV} + FPS_{Helo}] \times C3I \times CC\&D_{Threat}}{P} \qquad (4)$$

In equation (4), ISRs represents a measure of ISR accounting for the types/quantities of sensors in the UA, such as the measure of ISR determined in accordance with equation (2). Also, $FPS_{AFV}$ and $FPS_{Helo}$ represent the firepower scores of the AFVs and reconnaissance helicopters, respectively; C3I represents the measure of C3I for the UA, and CC&D represents the measure of CC&D for the threat.

The measure of utility associated with the characteristic mobility can be determined in any of a number of different manners. In one embodiment, for example, the measure of utility associated with mobility comprises a qualitative measure of mobility associated with the UA. The measure of mobility can be determined based upon any one or more elements of one or more units of the UA including, for example, the personnel and/or vehicles. The measure of mobility can also be determined based upon characteristics of the UA and/or one or more elements of the UA, such as firepower scores for the vehicles and/or an air situation factor that expresses the influence of air superiority, parity or inferiority of the UA. Further, the measure of mobility, like the measures of lethality and ISR, can additionally be based upon one or more environmental and/or situational factors that may be capable of degrading or enhancing the mobility of the UA.

More particularly, according to one embodiment, the measure of mobility may be determined according to a technique based upon the QJM model, as such are well known to those skilled in the art. In this embodiment, the measure of mobility can be determined by determining a measure of mobility independent of environmental and/or situational factors. In this regard, the measure of mobility can be determined independent of environmental and/or situational factors by summing the number of personnel in the UA with the number of vehicles, as well as one or more firepower scores for the vehicles.

The number of vehicles can be directly added to the number of personnel, firepower scores and vehicles. In one advantageous embodiment, however, the number of vehicles is weighted relative to the personnel to account for a general increase in mobility of vehicles as compared to the personnel. In addition, to account for the relative mobility of one or more different types vehicles, as compared to other types of vehicles, the numbers of different types of vehicles can be further weighted or scaled. In this regard, the number of vehicles can be determined by summing one or more different types of vehicles, where at least one type of vehicle has been multiplied by a scale factor. For example, the number of vehicles can be determined by multiplying the number of armored/tracked support vehicles and helicopters by one or more scale factors, then summing the products together with the number of trucks in the UA. Written notationally, for example, the number of vehicles scaled based on mobility (Vs) can be determined according to the following:

$$Vs = V + A/TS \times (f_3 - 1) + Helo \times (f_4 - 1) \qquad (5)$$

In equation (5), V represents the number of vehicles in the UA, A/TS represents the number of armored/tracked support vehicles and Helo represents the number of helicopters. Also in equation (5), $f_3$ (e.g., 2) and $f_4$ (e.g., 10) represent third and fourth scaling factors.

After summing the number of personnel in the UA with the number of vehicles and firepower scores for the vehicles, the sum can be multiplied by an air situation factor, and divided by the number of personnel. Written notationally, the measure of mobility ($M_1$) independent of environmental and/or situational factors can be determined according to the following:

$$M_1 = \frac{(P + f_5 \times V + FPS_{AFV} + FPS_{Helo}) \times \text{Air}}{P} \qquad (6)$$

In equation (6), P represents the number of personnel, $f_5$ (e.g., 12) represents a fifth scaling factor applied to the scaled number of vehicles (Vs), and $FPS_{AFV}$ and $FPS_{Helo}$ represent the firepower scores of the AFVs and reconnaissance helicopters in the UA, respectively. Also, Air represents an air situation factor of the UA, which may be determined in any of a number of different manners, such as from the QJM model. Then, after determining the measure of mobility ($M_1$) independent of environmental and/or situational factors, the measure of mobility can be determined based upon $M_1$ and one or more environmental and/or situational factors. In this regard, the measure of mobility (M) can be determined according to the following equation (7):

$$M = M_1 \times \left(1 + (M_1 - 1) \times \prod_m E/S_m\right) \qquad (7)$$

where m represents each environmental and/or situational factor used in determining mobility, and $E/S_m$ represents the mth environmental and/or situational factor.

The measure of utility associated with the characteristic survivability can be determined in any of a number of different manners. In one embodiment, for example, the measure of utility associated with survivability comprises a qualitative measure of survivability associated with the UA. The measure of survivability can be determined based upon the number of personnel in the UA, and one or more environmental (e.g., terrain) and/or situational (e.g., posture) factors. In addition, the measure of survivability can be determined based upon a comparison of the lethality of the UA and the lethality of a threat, as well as an air situation factor for the UA. More particularly, according to one embodiment, the measure of survivability can be determined by multiplying the number of personnel of the UA with the air situation factor for the UA, and the quotient of a posture situational factor and a terrain environmental factor.

After multiplying the number of personnel with the air situation factor, and quotient of the posture and terrain factors, the product can be multiplied by the square root of the ratio of measures of firepower for the UA and a threat, each of which may be determined as described above. Written notationally, the measure of survivability (S) can be determined as follows:

$$S = \sqrt{\frac{FP_{UA}}{FP_{Threat}}} \times P \times \text{Air} \times \frac{\text{Posture}}{\text{Terrain}} \qquad (8)$$

In equation (8), $FP_{UA}$ and $FP_{Threat}$ represent the firepower scores for the UA and the threat, respectively. Also, Posture represents the posture situational factor, and Terrain represents the terrain environmental factor, both of which may be determined in any of a number of different manners, such as from the QJM model.

As will be appreciated, it is typically desirable to maximize the survivability of a UA in battle. However, in various instances it is desirable to model a force structure without accounting for how the unit of action may perform in a battle. In such instances, as will be appreciated, measures of utility such as survivability typically varies little as compared to the same measures of utility for a threat. As such, according to various embodiments of the present invention, survivability can be ignored in modeling the force structure. It should be understood, however, that survivability can be determined and utilized to model the force structure, if so desired. In instances where the force structure model is based upon survivability, then, survivability can be treated in a manner similar to the other measures of utility (e.g., lethality, knowledgeability and/or mobility) which embodiments of the present invention attempt to maximize for the UA.

As will be appreciated, in modeling the force structure, it is desirable to maximize lethality, knowledgeability, mobility and survivability of the UA. And as will also be appreciated, it is also desirable to minimize the measures of utility for deployability, supportability and affordability. In this regard, after determining the firepower (lethality), ISR (knowledgeability), mobility and survivability, the measures of utility associated with the characteristics affordability, deployability and supportability can be determined. Before determining the other measures of utility, however, the measures of utility for lethality, knowledgeability, mobility and survivability can be combined into a "composite" measure of utility associated with the characteristic "effectiveness." In this regard, the measure of utility for effectiveness is based upon the lethality, knowledgeability, mobility and survivability of the UA, and can more particularly be based upon the relative lethality, knowledgeability, mobility and survivability of the UA compared to a threat, which may be defined in the same manner as the UA.

According to one advantageous embodiment, the measure of utility for effectiveness comprises a quantitative force correlation score of the UA with respect to a threat. To determine the force correlation score of the UA, after determining the measures of utility for lethality, knowledgeability, mobility and survivability of the UA, the same measures of utility are determined for a threat unit of action, as shown in block 22. The threat can comprise any of a number of different units of action, but in one embodiment, the threat comprises a unit of action defined in the same manner as described above for the UA. Also, the measures of utility for the threat can be determined in any of a number of different manners, such as in the same manner described above for the UA.

After determining the measures of utility for lethality, knowledgeability, mobility and survivability of the UA and the threat, a power score can be determined for each of the UA and the threat. The power scores can be determined in any of a number of different manners, such as by the product of the measures of utility for lethality, knowledgeability, mobility and survivability. In notational terms, the power score for the UA ($P_{UA}$) and threat ($P_{Threat}$) can be determined as follows:

$$P_{UA,Threat} = FP_{UA,Threat} \times ISR_{UA,Threat} \times M_{UA,Threat} \times S_{UA,Threat} \quad (9)$$

where $FP_{UA,Threat}$, $ISR_{UA,Threat}$, $M_{UA,Threat}$ and $S_{UA,Threat}$ represent the firepower (lethality), ISR (knowledgeability), mobility and survivability, respectively, of the UA and threat.

With the power scores for the UA and threat, the force correlation score for the UA can be determined by relating the power score of the UA to the power score of the threat, as shown in block 24. To determine the force correlation score of the UA, the power score of the UA can be related to the power score of the threat in any of a number of different manners. For example, in one embodiment, the force correlation score of the UA is determined by the quotient of the UA power score and threat power score.

More particularly, the force correlation score (FC) can be determined as follows:

$$FC = \frac{P_{UA}}{P_{Threat}} \quad (10)$$

As will be appreciated, in modeling the force structure, it is desirable to maximize the force correlation score of the UA, while minimizing the measures of utility for deployability, supportability and affordability. Thus, after determining the force correlation score of the UA, the measures of utility for deployability, supportability and affordability can be determined for the UA, as shown in block 26.

The measure of utility associated with the characteristic deployability can be determined in any of a number of different manners, such as based upon the personnel, vehicles and weapons in the UA. As will be appreciated by those skilled in the art, deployability is typically viewed as a measure of responsiveness of the force structure, with an optimal force structure capable of being deployed, and capable of quickly and rapidly concentrating combat power in an operational area. In the context of the FCS program, for example, the goal of the force structure is to be capable of being deployed anywhere in the world in 96 hours. As deployability is typically viewed as a measure of responsiveness, the measure of utility associated with deployability in one embodiment is based upon a qualitative measure of UA weight.

The measure of UA weight can be determined in a number of different manners, but is typically determined based upon a weight associated with each of the vehicles, munitions and miscellaneous elements in the UA. More particularly, the measure of UA weight can be determined by aggregating the weight of the vehicles, munitions and miscellaneous elements in the UA. Written notationally, the measure of UA weight (W) can be determined according to the following:

$$W = VW + MW + MsW \quad (11)$$

where VW, MW and Ms W represent the weight of the vehicles, munitions and miscellaneous elements in the UA, respectively.

The weight of the vehicles (VW) can be determined by multiplying the quantity of each type of vehicle with the weight of the respective type of vehicle. The products for each type of vehicle can then be aggregated to determine the weight of the vehicles in the UA. In notational terms, the weight of the vehicles in the UA can be determined as follows:

$$VW = \sum_n V_n \times VW_n \quad (12)$$

In equation (12), n represents each type of vehicle in the UA, $V_n$ represents the quantity of the nth type of vehicle and $VW_n$ represents the weight of the nth type of vehicle.

The weight of munitions (MW) can be determined in any of a number of different manners based upon the types and quantities of weapons in the UA, as well as the respective weight per round and number of rounds fired per time period. The number of rounds fired per time period can be determined in any of a number of different manners. For example, the number of rounds fired per time period for different types of weapons can be determined from historical data, such as historical data published in Department of the Army, *Staff Officers' Field Manual: Organizational, Technical, and Logistical Data Planning Factors* (Volume 2), FM 101-10-1/2 (1987), the contents of which are hereby incorporated by reference in its entirety.

More particularly, the weight of munitions can be determined by determining the weight of munitions for each type of weapon by multiplying the quantity of the respective type of weapon by the number of rounds fired from the respective type of weapon per time period. Thereafter, the resulting number of rounds for the respective type of weapon can be multiplied by the weight per round to thereby determine the weight of munitions for the respective type of weapon. The total weight of munitions can then be determined by aggregating the weight of munitions across all of the types of weapons and multiplying by a given time period (e.g., days). In notational terms, the total weight of munitions can be determined as follows:

$$MW = t \times \sum_i Q_i \times Rnds_i \times RW_i \qquad (13)$$

where, as before, i represents each type of weapon, and $Q_i$ represents the quantity of the ith type of weapon. In equation (13), t (e.g., 7 days) represents a given time period. Also, $Rnds_i$ represent the number of rounds fired per time period for the ith type of weapon, and $RW_i$ represents the weight per round for the rounds fired from the ith type of weapon.

As will be appreciated by those skilled in the art, historical data for the number of rounds fired per time period for different types of weapons can require modification to most accurately determine the weight of munitions. For example, the *Staff Officers' Field Manual* presents historical data in the context of a force, as opposed to the context of the type of weapon firing the respective rounds. In this regard, the historical data presented in the *Staff Officers' Field Manual* relates the quantity of 0.50 caliber machine guns in an armored division to the quantity and caliber of other weapons that comprise the armored division. Also, the historical data in the *Staff Officers' Field Manual* is presented for J-series forces attacking at a combat power ratio of approximately 2:1 and higher, and defending at a combat power ratio of approximately 1:2 and lower. Different force structures, however, may have different specifications for combat power ratios required to attack and defend. For example, the FCS project specifies a UA attacking at a combat power ratio of approximately 1:2 and higher, and defending at a combat power ratio of approximately 1:4 and lower. In addition, the historical data presented in the *Staff Officers' Field Manual* is based upon J-series forces including mostly traditional, "dumb" weapons. In contrast, in many instances it is desirable to define the UAs to include more sophisticated, "smart" weapons in addition to traditional weapons.

To tailor historical data for the number of rounds fired per time period for different types of weapons, the historical data can be modified to account for differences between the weapons and UAs from which the historical data was derived, and the weapons and UAs defined in accordance with embodiments of the present invention. For example, the number of rounds fired per time period for each type of weapon can be determined by performing a multiple linear regression on historical data presented in the *Staff Officers' Field Manual* (e.g., data presented in Table 2-16). Written notationally, then, the number of rounds fired per time period ($Rnds_i$) for the ith type of weapon can be determined as follows:

$$Rnds_i = 0.0425198 \times e^{0.025341 \times caliber_i} \times RoF_i^{1.222342} \times Q_i^{-0.11108} \qquad (14)$$

In equation (14), $caliber_i$ and $RoF_i$ represent the caliber and rate of fire of the ith type of weapon.

The weight of the miscellaneous elements (MsW) in the UA can be determined in a number of different manners. In one embodiment, the weight of miscellaneous elements can be determined based upon empirical data relating to an estimate of the total weight associated with deploying a force structure unit as a function of the quantity of personnel and unit type. The empirical data can be determined in any of a number of different manners, such as from the Force and Organizational Cost Estimating System (FORCES) of the U.S. Army Cost and Economic Analysis Center (CEAC), where the UA is considered a mechanized unit. From the estimate of the total weight (TW), the weight of the miscellaneous elements (MsW) can be determined by subtracting the weight of the vehicles (VW), such as in accordance with the following:

$$MsW = TW - VW \qquad (15)$$

As with the other measures of utility, the measure of utility associated with the characteristic supportability can be determined in any of a number of different manners. In one embodiment, for example, the measure of utility associated with supportability comprises a qualitative measure of supportability associated with the UA. As will be appreciated by those skilled in the art, a force structure must be sustainable across a broad spectrum of conflict. In this regard, supportability requirements often relate to the continuous, uninterrupted provision of support to the force structure. A full spectrum UA often requires support capability that allows commanders to reduce stockpiles in theater while relying on technology to provide sustained velocity management and real-time tracking of supplies and equipment.

In one embodiment of the present invention, like the measure of deployability, the measure of supportability is determined based upon the personnel, vehicles and weapons in the UA. Similar to the measure of deployability, the measure of supportability in one embodiment is based upon a qualitative measure of the weight of supplies in the UA. In force structures such as the U.S. Army, supplies are categorized into nine often-utilized classes: subsistence (class I), general supply (class II), Petroleum, Oils, Lubricants (POL) (class III), construction (class IV), munitions (class V), personal demand items (class VI), major end items (class VII), medical (class VIII) and repair parts (IX). In one embodiment of the present invention, then, the weight of supplies can be determined by aggregating the weight of supplies in each of a number of different classes of supplies, such as those classes defined by the U.S. Army. More particularly, the weight of supplies (SW) can be determined as follows:

$$SW = \sum_c Sup_c \qquad (16)$$

where c represents each class of supplies and $Sup_c$ represents the weight of the cth class of supplies.

The weight of supplies in each class can be determined in a number of different manners. For example, in accordance with models developed by the U.S. Army Combined Arms Support Command (CASCOM), the weight of supplies in classes I, II and VIII can be determined based upon the number of personnel, and can also be determined based upon historical and empirical data. In addition, the weight of supplies in classes IV, VI and VII can be determined based upon the number of personnel, and can also be determined based upon historical and empirical data. More particularly with respect to class I (subsistence), historical data in the *Staff Officers' Field Manual* and more recent CASCOM data provide food consumption in pounds/person/day. Also, the U.S. Army maintains data related to water consumption in gallons/person/day, from which pounds/soldier/day for water can be determined. Utilizing the food and water consumption data, then, the total weight of class I supplies can be determined per person per day.

After determining the total weight of class I supplies per person per day, the total weight can be multiplied by the number of personnel and a given number of days (fraction, integer or mixed integer number of days), to determine the total weight of class I supplies for the UA. As will be appreciated, however, the consumption of food and water can be based upon environmental factors such as climate. For example, personnel in a desert climate generally consume more food and water than the same personnel in a more temperate climate. As such, the weight of class I supplies can account for such climate differences by multiplying the total weight of class I supplies for the personnel located in one or more climates by respective climate factors. In notational terms, then, the weight of class I supplies ($Sup_1$) in the UA can be determined as follows:

$$Sup_1 = fc \times wc \times t \times \sum_b P_b \times E_b \tag{17}$$

In equation (17), fc and wc represent food and water consumption, respectively, in weight/person/time period; and t (e.g., 7 days) represents a given time period. Also in equation (17), b represents the bth type of climate, and $P_b$ and $E_b$ represent the number of personnel located in the bth type of climate and bth climate factor, respectively. As will be appreciated, the number of personnel located in each type of climate, as well as the climate factors, can be determined in any of a number of different manners, such as in accordance with CASCOM models.

As with the weight of supplies in class I, the weight of supplies in classes II, IV, VI, VII and IX can be determined based upon historical and empirical data, such as from the *Staff Officers' Field Manual* and CASCOM. In this regard, historical and empirical data can be utilized to determine the weight of general supplies (class II), construction supplies (class IV), personal demand items (class VI), major end items (class VII), and repair parts (class IX), all of which are expressed in weight per person per time period. The weight of supplies in classes II, IV, VI and VII can then be determined by multiplying the respective weights by the number of personnel in the UA, and a given time period. More particularly, the weight of supplies in classes II, IV, VI and VII can be determined according to the following equation (18).

$$Sup_g = w_g \times P \times t \tag{18}$$

In equation (18), g=2, 4, 6, 7 or 9 and represents the weight of supplies in classes II, IV, VI, VII or IX, respectively, in weight per person per time period.

The weight of supplies of medical supplies (class VIII), like the weight of supplies in classes I, II, IV, VI, VII and IX can be determined based upon historical and empirical data, such as from the *Staff Officers' Field Manual* and CASCOM. In this regard, historical and empirical data can be utilized to estimate a number of personnel casualties per given number of personnel over given time frame (e.g., 3 days), where the casualty rate can, but need not, be based upon posture (e.g., attack, defend, etc.). In addition, historical and empirical data can be utilized to determine the weight of medical supplies per casualty per time period. To determine the weight of medical supplies, then, the number of casualties per given number of personnel over the given time frame can be divided by the given time frame, and thereafter multiplied by the number of personnel and the weight of medical supplies per casualty per time period. More particularly, the weight of supplies in class VIII ($Sup_8$) can be determined according to the following equation (19).

$$Sup_8 = cas \times w_8 \times P \times t \tag{19}$$

In equation (19), cas represents the number of casualties per given number of personnel, and $W_8$ represents the weight of class VIII supplies per casualty per time period.

The weight of munitions in class V can be determined in a number of different manners, such as in a manner described above with respect to deployability. The weight of POL supplies in class III can be determined by determining the weight of POL for each vehicle type by multiplying a distance per time period (e.g., miles per day) and a vehicle weight. The distance per time period can be determined in a number of different manners. In one embodiment, for example, the distance per time period is extracted from data provided by a CASCOM operational tempo (OPTEMPO) database. After multiplying the distance per time period and the vehicle weight for a respective type of vehicle, the resulting product can then be divided by a number of miles per gallon of POL per unit of vehicle weight, which can be assumed to be a constant (e.g., 79) based upon a given vehicle density (e.g., diesel density). The resulting weight for the respective type of vehicle can then be multiplied by the quantity of the respective vehicle. The weight of POL for each type of vehicle can then be aggregated to determine the weight of POL supplies in class III. Written notationally, the weight of POL supplies in class III ($Sup_3$) can be determined as follows:

$$Sup_3 = \sum_n V_n \times \frac{MPD_n \times VW_n}{M/UW} \tag{20}$$

As shown in equation (20), as before, n represents each type of vehicle, $V_n$ represents the number of the nth type of vehicle, and $VW_n$ represents the weight of the nth type of vehicle. Also, $MPD_p$ represents the distance per time period (e.g., miles per day) of the nth vehicle, and M/UW represents the number of miles per gallon of POL per unit of vehicle weight.

The weight of repair parts in class IX, like the weight of other supply classes, can be determined in a number of different manners. For example, the weight of repair parts can be determined from historical data, such as that provided in Table 2-23 of the *Staff Officers' Field Manual*. As provided in Table 2-23, for example, the *Staff Officers' Field Manual* provides the tons per day of class IX supplies for various division and brigade level units in which the personnel of the respective unit is known. In addition, the tons per day are further parsed by level of activity or commitment (e.g., heavy battle versus reserves). With historical data, such as that provided in *Staff Officers' Field Manual*, then, regression analysis can be performed using the quantity of personnel in the UA and a unit type (e.g., mechanized—as indicated above) to determine the weight of repair parts.

As will be appreciated, the various weights given above may be determined from historical and empirical data provided by one or more sources, such as the *Staff Officers' Field Manual* and CASCOM. In such instances in which the data is provided by multiple sources, the data from one source may be utilized over the other sources based upon reliability and accuracy. Alternatively, the data from two or more sources may be utilized, such as by averaging the data from such sources. As will also be appreciated, the weight of various supplies may be insignificant as compared to the weight of other supplies. In such instances, the weight of supplies that provide an insignificant contribution to the weight of supplies in the UA may be ignored to thereby reduce the time required to determine the overall weight of supplies in the UA. For example, the weight of packaged petroleum products has historically been relatively light as compared to other supplies in other classes. As such, whereas the weight of class IIIP (packaged petroleum products) supplies may be determined, it may also be ignored in the total weight of supplies in many instances without affecting the aggregate weight of all supply classes.

As will further be appreciated by those skilled in the art, the weight of supplies in various classes, such as class VII (major end items) and class IX (repair parts), may change significantly over time, particularly as the technology related to such supplies changes. As such, determining the weight of supplies in these classes based upon historical and empirical data, particularly older historical and empirical data, may not result in the most accurate determinations of weight. To more accurately represent the current weight of such supplies, the weight per person per day for one or more of the classes of supplies above may be modified as desired to account for differences that may exist between the weight of supplies given by historical and empirical data, and the weight of supplies in the UA. For example, the *Staff Officers' Field Manual* provides a weight per person per day for major end items in class VII, where the weight per person per day is based upon equipment reliability and survivability. Thus, to account for reliability/survivability improvements in class VII supplies, the weight per person per day of major end items may be modified by an improvement factor (IF), such as by multiplying $w_7$ in equation (18) by IF.

As with the other measures of utility, the measure of utility associated with the characteristic affordability can be determined in any of a number of different manners. In one embodiment, for example, the measure of utility associated with supportability comprises a qualitative measure of life cycle costs (LCC) associated with the UA. More particularly, the LCC can be determined for each element of the UA as the sum of (a) development (nonrecurring) costs; (b) production/installation (recurring) costs; and (c) sustainment, or operating and support (O&S) costs. The LCCs can then be aggregated across all elements to determine the LCC for the UA.

Whereas the development costs can be determined in a number of different manners, in one embodiment, the development costs are determined by first estimating an average development cost for a single unit of each element in the UA, and aggregating the development costs over all elements. Like the development costs, the average development cost can be estimated in any of a number of different manners. For example, the average unit development cost (AUDC) for each type of weapon, missile, vehicle and rotorcraft (manned and unmanned) can be determined, for example, from historical and empirical data, such as that provided by Federation of American Scientists. In this regard, the Federation of American Scientists can provide data not only as to the costs of various types of weapons, missiles, vehicles and rotorcraft, but can also provide characteristics of the various types of weapons, missiles, vehicles and rotorcraft, such as the physical (e.g. weight, volume) and performance (e.g. speed, range, rate of fire) characteristics of various types of weapons, missiles, vehicles and rotorcraft.

With the development costs of various types of weapons, missiles, vehicles and rotorcraft, as well as the characteristics of those weapons, missiles, vehicles and rotorcraft, expressions can be developed for the AUDC of the weapons, missiles, vehicles and rotorcraft based upon the characteristics of the respective weapons, missiles, vehicles and rotorcraft. The expressions can be developed in any of a number of different manners, such as in accordance with conventional statistical analysis/regression techniques. And in accordance with one embodiment of the present invention, one or more of the expressions comprise cost estimating relationships (CERs) developed by the U.S. Army for various weapons, missiles, vehicles and rotorcraft. For example, the AUDC for vehicles (Vaudc) can be expressed as a function of characteristics of the vehicles in accordance with the following CER:

$$Vaudc_n = -14.402 + 0.054 \times SGnd_n + 0.075 \times SWtr_n - \qquad (21)$$
$$0.008 \times Range_n + 0.044 \times VW_n - 0.097 \times \text{Crew\_Pax}_n +$$
$$3.465 \times \log(YrDevt_n - 1900) + \text{If (Tracked} = 1, 0.763, 0)$$

In equation (21), n represents each type of vehicle, $SGnd_n$ and $SWtr_n$ represent the ground and water speed, respectively, of the nth type of vehicle, and $Range_n$ represents the range of the nth type of vehicle. Also in equation (21), $\text{Crew\_Pax}_n$ represents the number of personnel on board the nth type of vehicle, $YrDevt_n$ represents a cost and/or technology adjustment over time for the nth type of vehicle. Further, the "If" expression represents a Boolean function that accounts for various types of tracked vehicles typically costing more than wheeled vehicles.

Like development costs, production costs for the UA can be determined in a number of different manners, such as by determining the production costs for each element and aggregating the production costs for each element. In one embodiment, for example, the production costs for each element are determined based upon the development costs for, and quantity of, the respective element. In addition, the production costs for each element can be further based upon the experience of a manufacturer in producing the respective element. In this regard, whereas one might expect the cost of producing each unit of the element to remain constant, the cost to produce each element typically more than the expected cost of producing each unit for the first units produced. And as the number of units produced increases, the manufacturer typically gains experience that drives the cost to produce each element down to the expected cost and below, and thereafter eventually leveling to an optimum cost of producing each element.

The change in the cost to produce each element can generally be considered to be attributable to a "learning curve" experienced by the manufacturer in manufacturing the element. As such, the total cost for each element can be determined by equating the AUDC (i.e., development costs) for the respective element as the cost of producing the first unit of the element, often referred to as the T1 cost. Also, a learning curve can be determined for the respective element, such as in accordance with a number of different conventional techniques (e.g., based on historical data). The total cost for each element can then be determined based upon the T1 cost for the respective element and a respective learning curve in accordance with any of a number of cost modeling techniques, such as in accordance with the Wright or Crawford techniques.

Again like the development costs, and like the production costs, the O&S costs can be determined in a number of different manners. In accordance with one such technique, four different estimating models are brought to bear, namely: (a) annual pay and allowances, (b) annual maintenance and repair costs, (c) annual consumables costs, and (d) annual munitions consumptions costs. More particularly, for example, annual salaries for the personnel the UA can be estimated based upon historical and empirical data, such as that provided by the FORCES. In this regard, data provided by FORCES includes lists of existing U.S. Army units, as well as the respective quantity of personnel, and annual pay and allowances. Utilizing conventional statistical analyses, then, annual personnel pay and allowances for the UA can be determined based upon the data provided by the FORCES without having to parse the costs according to rank and years of service of the respective personnel.

Like with annual pay and allowances, maintenance and repair costs associated with the UA can be determined based upon historical and empirical data, such as that provided by the FORCES. For example, the annual maintenance and repair costs can be determined via regression of maintenance cost data against hardware characterization data, both of which may be provided by the FORCES. In this regard, the FORCES maintenance cost data and performance data can be used to develop the necessary relationships. More particularly, for example, consumables such as fuels and oils can be estimated using data, such as that provided by the FORCES (annual consumables costs), Federation of American Scientists (system characterization), and/or OPTEMPO (annual operating hours/miles). Using conventional regression techniques, then, annual consumables costs can be estimated for the UA.

Annual munitions consumption costs, like the other O&S costs, can be determined in a number of different manners, such as from historical and empirical data (e.g., FORCES data). Then, once costs have been determined for (a) annual pay and allowances, (b) annual maintenance and repair, (c) annual consumables, and (d) annual munitions consumptions, the UA annual O&S costs can be determined by aggregating the costs for (a)-(d). Having determined the development costs, production costs, and O&S costs, total life cycle cost (LCC) can be determined by aggregating the development costs, production costs and O&S costs.

After determining the measures of utility for deployability, supportability and affordability, the method can be repeated, as shown in block 28, by defining a number of other UAs, such as in the same manner as defining the UA described above. Then, for each UA, the force correlation score and deployability, supportability and affordability can be determined. The method can define any of a number of different UAs, numbering from one to hundreds, or even thousands. Irrespective of the number of UAs defined, however, after defining the UAs and determining the measures of utility with respect to each defined UA, one or more optimal UAs can be identified from the defined UAs. As will be appreciated, with the force structure modeled in accordance with the embodiments of the present invention, like many multiple objective systems, it is rarely possible to identify a UA that is optimal in all measures of utility when various of the measures of utility may compete with one another. In such instances, those UAs that are on the "envelope" of the trade-off space typically generate the greatest interest. This envelope is referred to as the "non-dominated," or Pareto Optimal, set of UAs. In this regard, a UA design, d*, is on this envelope if it is not dominated by any other UA design. That is, there is no design d' that is at least as good as d* in all dimensions and strictly better than d* in at least one dimension. Simply stated, assume that several different UA designs have the same measure effectiveness, which as described below, may be determined based upon one or more of those measures of utility sought to be maximized. In such instances, the optimal UA designs would consist of those that have the lowest measure of cost associated with the UA, where the measure of cost may be determined based upon one or more of those measures of utility sought to be minimized.

The challenge is to find the Pareto Optimal set of UA designs. Once found, an optimal UA can be identified from the Pareto Optimal set of UA designs. Thus, after defining the UAs and determining the measures of utility for each, a Pareto Optimal set of UA designs can be determined, as shown in block 30. The Pareto Optimal set can be determined according to any of a number of different techniques. According to one advantageous embodiment, the Pareto Optimal set is determined according to a method based upon a one-pass filtering process applied to the defined UAs (see block 10). That is, the set of UA designs under consideration consist of a finite set of point UA designs, $U=\{d_n\}$, where $n=1, 2, \ldots N$, and N represents the number of defined UAs.

According to the method for determining the Pareto Optimal set according to this embodiment, the set of UA designs U is provided, along with the associated values of M different measures of utility (e.g., lethality, knowledgeability, mobility, survivability, deployability, supportability, affordability, etc.) for each UA design, i.e., $\{o_m(d_n)\}$, where $m=1, 2, \ldots M$. After receiving the set of UA designs U, the set of designs can be lexigraphically sorted, such as by utilizing a bubble sort technique. The lexigraphic ordering can be constructed from the measures of utility. In particular, UA design $d_i$ can be considered lexigraphically greater than or equal to $d_j$ if (a) $d_i$ and $d_j$ are equal in all metric dimensions; or (b) if $d_i$ and $d_j$ are equal in the first k−1 dimensions but $d_i$ is strictly better than $d_j$ in the kth dimension. It should be noted that if $d_i \geq d_j$, then $d_j$ does not dominate $d_i$ (it is not the case, however, that $d_i$ must dominate $d_j$ since $d_i$ and $d_j$ may be equal in all metric dimensions. Using such a property of the lexigraphically sorted set of UA designs, it is possible to extract the Pareto Optimal set with a single pass filter of the sorted set. And as will be appreciated, such lexigraphic ordering simultaneously operates on any combination of "minimization" and "maximization" of the M different measures of utility.

In addition to determining the Pareto Optimal set, embodiments of the present invention, can also extend the method to identify "near-Pareto" Optimal UA design sets, where an error tolerance may be specified for each measure of utility. By identifying the "near-Pareto" Optimal sets, UA designs can be considered equivalent (in a given metric) if the measures of utility of the respective UA designs evaluate to the same value within the specified tolerance. All UA designs that are within a predefined epsilon of the boundary can then be collected. For an illustration of various UAs including those in the Pareto Optimal set, and those in one or more near-Pareto Optimal sets, see FIG. 5.

In this figure, the UAs are plotted in two dimensions with the axes representing the values of two different measures of utility, such as affordability and effectiveness, although the UAs would typically be plotted in three or more dimensions to accommodate additional measures of utility. The Pareto Optimal set includes these UAs along the leading edge, with the near-Pareto Optimal set, although not shown, including those UAs within a predefined epsilon of the leading edge. Shown by a solid line drawn through various UAs in the embodiment of FIG. 5, the leading edge generally extends left to right along or near the UAs having the lowest value as measured by the measure of utility for affordability on the vertical axis. In this regard, in the illustration of FIG. 5, the objective is to minimize the measure along the vertical axis and maximize the measure along the horizontal axis. However, the leading edge may be defined differently in the measures are to be maximized and/or minimized in a different manner.

After determining the Pareto Optimal set and the near-Pareto Optimal sets, one or more optimal UA designs can be selected from the Pareto Optimal set and near-Pareto Optimal sets, as shown in block 32. In this regard, the optimal UA designs can be selected in any of a number of different manners. For example, in accordance with one embodiment of the present invention, by plotting the Pareto Optimal set (see FIG. 5) in multi-dimensional space, the optimal UA designs can be selected therefrom. More particularly, the optimal UA designs can be selected from inflection points on the edge of the plot of the Pareto Optimal set, such as the ones at and/or near the inflection point. However, when two or more UA designs have the same force correlation score, the designs having the lower LCC can be selected. And when two or more UA designs have the same cost, the designs having the higher force correlation score can be selected.

In one particularly advantageous embodiment, downselected UA designs are taxonomized as "Preferred," "Alternate" and "Acceptable." In this regard, "Preferred" UAs are those that generate the highest force correlation score, but also have the highest cost. These UA designs are found after the last or ultimate Pareto inflection (moving from left to right on the plot). "Alternate" UAs usually occur after the penultimate inflection. Such UA designs typically have lower force correlation scores, but also typically cost less. "Acceptable" UAs, as long as they have a force correlation score above a predefined threshold (e.g., 2.0), may be found before even the first inflection of the Pareto. As such, "Acceptable" UA designs have the lowest force correlation score, but also the least cost.

As shown in FIG. 6, the system of the present invention is typically embodied by a processing element and an associated memory device, both of which are commonly comprised by a computer 34 or the like. In this regard, as indicated above, the method of embodiments of the present invention can be performed by the processing element manipulating data stored by the memory device with any one of a number of commercially available computer software programs. In one embodiment, the method can be performed with data that is capable of being manipulated and/or presented in spreadsheet form. For example, the method can be performed by the processing element manipulating data stored by the memory device with Excel, a spreadsheet software program, including Crystal Ball, a Monte Carlo simulation software program. The computer can include a display 36 for presenting information relative to performing embodiments of the method of the present invention, including the various distributions, models and/or conclusions as determined according to embodiments of the present invention. To plot information relative to performing embodiments of the method of the present invention, the computer can further include a printer 38.

Also, the computer 34 can include a means for locally or remotely transferring the information relative to performing embodiments of the method of the present invention. For example, the computer can include a facsimile machine 40 for transmitting information to other facsimile machines, computers or the like. Additionally, or alternatively, the computer can include a modem 42 to transfer information to other computers or the like. Further, the computer can include an interface (not shown) to a network, such as a local area network (LAN), and/or a wide area network (WAN). For example, the computer can include an Ethernet Personal Computer Memory Card International Association (PCM-CIA) card configured to transmit and receive information to and from a LAN, WAN or the like.

In one advantageous technique applicable to embodiments of the present invention, the methods according to embodiments of the present invention may be embodied in a software or data module, component or the like that can be manipulated or otherwise operated within a spreadsheet software package such as Excel, designed by Microsoft Corporation of Redmond, Wash. Alternatively, the methods according to embodiments of the present invention may be embodied in a software or data module, component or the like that can be manipulated or otherwise operated within any of a number of other software packages, such as the Design Sheet software package, developed by Rockwell Scientific Company LLC of Thousand Oaks, Calif.

According to one aspect of the present invention, the system of the present invention generally operates under control of a computer program product. The computer program product for performing the methods of embodiments of the present invention includes a computer-readable storage medium, such as the non-volatile storage medium, and computer-readable program code portions, such as a series of computer instructions, embodied in the computer-readable storage medium.

In this regard, FIGS. 2 and 3 are flowcharts of methods, systems and program products according to the invention. It will be understood that each block or step of the flowchart, and combinations of blocks in the flowchart, can be implemented by computer program instructions. These computer program instructions may be loaded onto a computer or other programmable apparatus to produce a machine, such that the instructions which execute on the computer or other programmable apparatus create means for implementing the functions specified in the flowchart block(s) or step(s). These computer program instructions may also be stored in a computer-readable memory that can direct a computer or other programmable apparatus to function in a particular manner, such that the instructions stored in the computer-readable memory produce an article of manufacture including instruction means which implement the function specified in the flowchart block(s) or step(s). The computer program instructions may also be loaded onto a computer or other programmable apparatus to cause a series of operational steps to be performed on the computer or other programmable apparatus to produce a computer implemented process such that the instructions which execute on the computer or other programmable apparatus provide steps for implementing the functions specified in the flowchart block(s) or step(s).

Accordingly, blocks or steps of the flowchart support combinations of means for performing the specified functions, combinations of steps for performing the specified functions and program instruction means for performing the specified functions. It will also be understood that each block or step of the flowchart, and combinations of blocks or steps in the flowchart, can be implemented by special purpose hardware-based computer systems which perform the specified functions or steps, or combinations of special purpose hardware and computer instructions.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A method for modeling a force structure comprising:
defining a plurality of unique units of action, including determining qualities or characteristics of the respective units of action;
determining, for each unit of action, a plurality of measures of utility, wherein at least one measure of utility has a maximization objective and at least one measure of utility has a minimization objective;
comparing the units of action based upon the objectives of the plurality of measures of utility of each unit of action; and
identifying at least one optimal unit of action based upon the comparison to thereby model the force structure.

2. A method according to claim 1, wherein determining a plurality of measures of utility comprises determining, for each unit of action, a plurality of measures of utility including measures of at least two of lethality, knowledgeability, mobility or survivability, and wherein the measures of at least two of lethality, knowledgeability or mobility each have a maximization objective.

3. A method according to claim 2 further comprising:
determining, for each unit of action, a measure of utility for effectiveness based upon the measures of at least two of lethality, knowledgeability, mobility or survivability, wherein the measure of effectiveness has a maximization objective,
and wherein comparing the units of action comprises comparing the units of action based upon the measure of effectiveness and at least one measure of utility with a minimization objective.

4. A method according to claim 3, wherein determining a measure of utility for effectiveness comprises:
determining, for each unit of action and a threat, a power score based upon at least two of lethality, knowledgeability, mobility or survivability for the unit of action; and determining, for each unit of action, a measure of utility for effectiveness based upon the power score for the respective unit of action in relation to the power score for the threat.

5. A method according to claim 1, wherein determining a plurality of measures of utility comprises determining, for each unit of action, a plurality of measures of utility including measures of at least two of deployability, supportability or affordability, wherein the measures of at least two of deployability, supportability or affordability each have a minimization objective,
and wherein comparing the units of action comprises comparing the units of action based upon the measures of at least two of deployability, supportability or affordability and at least one measure of utility with a maximization objective.

6. A method according to claim 1, wherein identifying at least one optimal unit of action comprises:
determining a Pareto Optimal set of units of action based upon the comparison; and
selecting at least one optimal unit of action from the Pareto Optimal set.

7. A method according to claim 1, wherein each unit of action comprises an aggregation of personnel, sensors, weapons and mobile combat systems, wherein defining a plurality of units of action comprises defining, for each unit of action, the personnel, sensors, weapons and mobile combat systems of the respective unit of action, and wherein determining a plurality of measures of utility comprises determining, for each unit of action, a plurality of measures of utility based upon the personnel, sensors, weapons and mobile combat systems of the respective unit of action.

8. A method according to claim 1, wherein determining a plurality of measures of utility comprises determining, for each unit of action, a plurality of measures of utility including measures of effectiveness, supportability and affordability,
wherein the measure of effectiveness has a maximization objective,
wherein the measure of supportability relates to a provision of support to the respective unit of action, and has a minimization objective, and
wherein the measure of affordability relates to monetary expenditures associated with forming and maintaining the respective unit of action.

9. A system for modeling a force structure comprising:
a processor configured to define a plurality of unique units of action, including determining qualities or characteristics of the respective units of action, wherein the processor is configured to determine, for each unit of action, a plurality of measures of utility, wherein at least one measure of utility has a maximization objective and at least one measure of utility has a minimization objective, wherein the processor is also configured to compare the units of action based upon the objectives of the plurality of measures of utility of each unit of action, and thereafter identify at least one optimal unit of action based upon the comparison to thereby model the force structure.

10. A system according to claim 9, wherein the processor is configured to determine, for each unit of action, a plurality of measures of utility including measures of at least two of lethality, knowledgeability, mobility or survivability, and wherein the measures of at least two of lethality, knowledgeability or mobility each have a maximization objective.

11. A system according to claim 10, wherein the processor is further configured to determine, for each unit of action, a measure of utility for effectiveness based upon the measures of at least two of lethality, knowledgeability, mobility or survivability, wherein the measure of effectiveness has a maximization objective, and wherein the processor is configured to compare the units of action based upon the measure of effectiveness and at least one measure of utility with a minimization objective.

12. A system according to claim 11, wherein the processor is configured to determine, for each unit of action and a threat, a power score based upon at least two of lethality, knowledgeability, mobility or survivability, and wherein the processor is configured to determine, for each unit of action, the measure of utility for effectiveness based upon the power score for the respective unit of action in relation to the power score for the threat.

13. A system according to claim 9, wherein the processor is configured to determine, for each unit of action, a plurality of measures of utility including measures of at least two of deployability, supportability or affordability, wherein the measures of at least two of deployability, supportability or affordability each have a minimization objective, and wherein the processor is configured to compare the units of action based upon the measures of at least two of deployability, supportability or affordability and at least one measure of utility with a maximization objective.

14. A system according to claim 9, wherein the processor is configured to identify at least one optimal unit of action by determining a Pareto Optimal set of units of action based upon the comparison, and thereafter select at least one optimal unit of action from the Pareto Optimal set.

15. A system according to claim 9, wherein each unit of action comprises an aggregation of personnel, sensors, weapons and mobile combat systems, and wherein the processor is configured to determine, for each unit of action, a plurality of measures of utility based upon the personnel, sensors, weapons and mobile combat systems of the respective unit of action.

16. A computer program product for modeling a force structure, the computer program product comprising a computer-readable storage medium having computer-readable program code portions stored therein, the computer-readable program code portions comprising:
   a first executable portion for defining a plurality of unique units of action, including determining qualities or characteristics of the respective units of action;
   a second executable portion for determining, for each unit of action, a plurality of measures of utility, wherein at least one measure of utility has a maximization objective and at least one measure of utility has a minimization objective;
   a third executable portion for comparing the units of action based upon the objectives of the plurality of measures of utility of each unit of action; and
   a fourth executable portion for identifying at least one optimal unit of action based upon the comparison to thereby model the force structure.

17. A computer program product according to claim 16, wherein the second executable portion is for determining, for each unit of action, a plurality of measures of utility including measures of at least two of lethality, knowledgeability, mobility or survivability, and wherein the measures of at least two of lethality, knowledgeability or mobility each have a maximization objective.

18. A computer program product according to claim 17 further comprising:
   a fifth executable portion for determining, for each unit of action, a measure of utility for effectiveness based upon the measures of at least two of lethality, knowledgeability, mobility or survivability, wherein the measure of effectiveness has a maximization objective,
   and wherein the third executable portion is for comparing the units of action based upon the measure of effectiveness and at least one measure of utility with a minimization objective.

19. A computer program product according to claim 18, wherein the fifth executable portion is for determining the measure of utility for effectiveness by determining, for each unit of action and a threat, a power score based upon at least two of lethality, knowledgeability, mobility or survivability, and thereafter determining, for each unit of action, a measure of utility for effectiveness based upon the unit power score for the respective unit of action in relation to the power score for the threat.

20. A computer program product according to claim 16, wherein the second executable portion is for determining, for each unit of action, a plurality of measures of utility including measures of at least two of deployability, supportability or affordability, wherein the measures of at least two of deployability, supportability or affordability each have a minimization objective,
   and wherein the third executable portion is for comparing the units of action based upon the measures of at least two of deployability, supportability or affordability and at least one measure of utility with a maximization objective.

21. A computer program product according to claim 16, wherein the fourth executable portion is for identifying at least one optimal unit of action by determining a Pareto Optimal set of units of action based upon the comparison, and thereafter selecting at least one optimal unit of action from the Pareto Optimal set.

22. A computer program product according to claim 16, wherein each unit of action comprises an aggregation of personnel, sensors, weapons and mobile combat systems, and wherein the second executable portion is for determining, for each unit of action, a plurality of measures of utility based upon the personnel, sensors, weapons and mobile combat systems of the respective unit of action.

* * * * *